(12) United States Patent
Wang et al.

(10) Patent No.: US 8,817,434 B2
(45) Date of Patent: Aug. 26, 2014

(54) ELECTROSTATIC DISCHARGE (ESD) PROTECTION DEVICE

(75) Inventors: Chang-Tzu Wang, Taoyuan County (TW); Tien-Hao Tang, Hsinchu (TW); Kuan-Cheng Su, Taipei (TW)

(73) Assignee: United Microelectronics Corporation, Hsinchu (TW)

( * ) Notice: Subject to any disclaimer, the term of this patent is extended or adjusted under 35 U.S.C. 154(b) by 372 days.

(21) Appl. No.: 13/270,298

(22) Filed: Oct. 11, 2011

(65) Prior Publication Data

US 2013/0088800 A1   Apr. 11, 2013

(51) Int. Cl.
*H02H 9/00*   (2006.01)

(52) U.S. Cl.
CPC ........................ *H02H 9/00* (2013.01)
USPC ............................. 361/56; 361/91.1; 361/111

(58) Field of Classification Search
CPC combination set(s) only.
See application file for complete search history.

(56) References Cited

U.S. PATENT DOCUMENTS

| | | |
|---|---|---|
| 5,637,900 A | 6/1997 | Ker et al. |
| 5,831,316 A * | 11/1998 | Yu et al. .................. 257/401 |
| 5,959,820 A | 9/1999 | Ker et al. |
| 5,963,409 A * | 10/1999 | Chang ......................... 361/56 |
| 6,028,758 A | 2/2000 | Sharpe-Geisler |
| 6,310,379 B1 | 10/2001 | Andresen et al. |
| 6,657,835 B2 | 12/2003 | Ker et al. |
| 6,724,677 B1 | 4/2004 | Su et al. |
| 6,747,861 B2 | 6/2004 | Ker et al. |
| 6,867,957 B1 | 3/2005 | Tong et al. |
| 6,909,149 B2 | 6/2005 | Russ et al. |
| 7,009,252 B2 | 3/2006 | Lin et al. |
| 7,027,276 B2 | 4/2006 | Chen |
| 7,205,612 B2 | 4/2007 | Cai et al. |
| 7,368,761 B1 | 5/2008 | Lai et al. |
| 7,672,100 B2 | 3/2010 | Van Camp |
| 7,719,806 B1 * | 5/2010 | Boyd et al. ................ 361/56 |
| 7,889,470 B2 | 2/2011 | Ker et al. |
| 2003/0076636 A1 | 4/2003 | Ker et al. |
| 2004/0218322 A1* | 11/2004 | Chen et al. ................ 361/56 |
| 2006/0097330 A1* | 5/2006 | Yu et al. .................. 257/401 |
| 2006/0267102 A1 | 11/2006 | Cheng et al. |

* cited by examiner

*Primary Examiner* — Jared Fureman
*Assistant Examiner* — Terrence Willoughby
(74) *Attorney, Agent, or Firm* — WPAT, PC; Justin King

(57) ABSTRACT

An exemplary ESD protection device is adapted for a high-voltage tolerant I/O circuit and includes a stacked transistor and a gate-grounded transistor e.g., a non-lightly doped drain type gate-grounded transistor. The stacked transistor and the gate-grounded transistor are electrically coupled in parallel between an I/O pad and a grounding voltage of the high-voltage tolerant I/O circuit.

18 Claims, 3 Drawing Sheets

ELECTROSTATIC DISCHARGE (ESD) PROTECTION DEVICE

TECHNICAL FIELD

The disclosure generally relates to electrostatic discharge (ESD) protection technologies, and more particularly to an electrostatic discharge protection device with improved ESD level.

BACKGROUND

As the scale of devices in ICs has become smaller, the devices have become more vulnerable to electrostatic discharge. Hence, ESD has been one of the most important reliability issues for IC products and must be taken into consideration in the design phase of all ICs. Industrial standards require input/output (I/O) pins to pass ESD tests of 2000 volts of human body mode (HBM) and 200 volts of machine mode (MM). Generally, ESD protection devices are placed near I/O pads, protecting not only I/O circuit but also core circuits from ESD damage.

A conventional high-voltage tolerant I/O circuit is usually implemented by a stacked nMOS transistor. However, the stacked nMOS transistor configuration usually has a lower ESD level and slow turn-on speed of the parasitic lateral npn device, as compared with the single nMOS. Such disadvantages result from the longer base width of the lateral npn bipolar junction transistor (BJT) device in the stacked nMOS device. Therefore, an additional ESD protection design must be provided to protect the stacked nMOS. However, most of conventional designs need extra area for additional ESD protection circuit or ESD protection circuit, which are not impracticable in mass production.

SUMMARY OF EMBODIMENTS

Accordingly, an objective of the present disclosure is to provide an ESD protection device, so as to overcome the drawbacks in the prior art.

More specifically, an ESD protection device in accordance with an exemplary embodiment is adapted for a high-voltage tolerant input/output (I/O) circuit. The ESD protection device includes a stacked transistor and a gate-grounded transistor. The stacked transistor and the gate-grounded transistor are electrically coupled in parallel between an I/O pad and a grounding voltage of the high-voltage tolerant I/O circuit.

In an exemplary embodiment, the gate-grounded transistor for example is a non-lightly doped drain type gate-grounded transistor, and the stacked transistor is a lightly doped drain type stacked transistor.

In an exemplary embodiment, a layout structure of the stacked transistor for example includes multiple first finger transistor structures, and each of the first finger transistor structures includes two first gate fingers. A layout structure of the gate-grounded transistor for example includes multiple second finger transistor structures, and each of the second finger transistor structures includes a single second gate finger. Moreover, the first finger transistor structures for example are arranged intervally with the second finger transistor structures along a first direction, in detail, the second finger transistor structures may be arranged at two sides of the first finger transistor structures, or alternatively, the first finger transistor structures may be arranged at two sides of the second finger transistor structures. In addition, each of the first finger transistor structures and each of the second finger transistor structures may have equal layout areas, the first finger transistor structures and the second finger transistor structures may have equal quantities.

In an exemplary embodiment, a layout structure of the stacked transistor for example includes multiple first finger transistor structures, and each of the first finger transistor structures includes two first gate fingers. A layout structure of the gate-grounded transistor for example includes multiple second finger transistor structures, and each of the second finger transistor structures includes a single second gate finger. Moreover, the first finger transistor structures may be arranged successively along a first direction, the second finger transistor structures may be arranged successively along the first direction, and the first finger transistor structures may be arranged intervally with the second finger transistor structures along a second direction different from the first direction. In detail, the first finger transistor structures for example are arranged at two sides of the second finger transistor structures along the second direction, or the second finger transistor structures for example are arranged at two sides of the first finger transistor structures along the second direction, or the second finger transistor structures are arranged in a shape of ring e.g., rectangle ring to surround the first finger transistor structures. In addition, along the second direction, the second gate finger of at least one of the second finger transistor structures for example is co-linear with one of the two first gate fingers of at least one of the first finger transistor structures. The quantity of the first finger transistor structures and the quantity of the second finger transistor structures for example satisfy a relationship of integer times (e.g., multiple times) or non-integer times.

An ESD protection device in accordance with another exemplary embodiment, a layout structure thereof includes multiple finger stacked transistor structures and multiple finger gate-grounded transistor structures for example formed on a same substrate. The finger stacked transistor structures and the finger gate-grounded transistor structures all are electrically coupled between an I/O pad and a grounding voltage. The finger stacked transistor structures are arranged intervally with the finger gate-grounded transistor structures along a specified direction.

In an exemplary embodiment, the finger stacked transistor structures for example are arranged successively along a second direction different from the specified direction, the finger gate-grounded transistor structures for example also are arranged successively along the second direction. Along the specified direction, a gate finger of at least one of the finger stacked transistor structures may be co-linear with a gate finger of at least one of the finger gate-grounded transistor structures. Moreover, the quantity of the finger stacked transistor structures and the quantity of the finger gate-grounded transistor structures may satisfy a relationship of integer times (e.g., one times or multiple times) or non-integer times. In addition, the finger gate-grounded transistor structures for example are arranged in a shape of ring e.g., rectangle ring to surround the finger stacked transistor structures.

An ESD protection device in accordance with still another exemplary embodiment is adapted for an I/O circuit. The ESD protection device includes a multi-finger stacked transistor and a multi-finger gate-grounded transistor. The multi-finger stacked transistor and the multi-finger gate-grounded transistor are electrically coupled in parallel between an I/O pad and a grounding voltage of the I/O circuit. Moreover, the multi-finger stacked transistor for example is a lightly doped drain type multi-finger stacked transistor, and the multi-finger gate-grounded transistor for example is a non-lightly doped drain type multi-finger gate-grounded transistor.

In short, in the above described exemplary embodiments, by arranging a gate-grounded transistor (e.g., a non-lightly doped drain type gate-grounded transistor) to be electrically coupled in parallel with a stacked transistor in an ESD protection device, the better ESD level of the gate-grounded transistor thereby is in use for protecting the stacked transistor. Moreover, since the gate-grounded transistor may be configured with similar layout structure to that of the stacked transistor, the purpose of improving ESD level without increasing the device layout area can be achieved consequently.

BRIEF DESCRIPTION OF THE DRAWINGS

The above embodiments of the present disclosure will become more readily apparent to those ordinarily skilled in the art after reviewing the following detailed description and accompanying drawings, in which.

DETAILED DESCRIPTION OF EMBODIMENTS

Hereinafter, the disclosure will now be described more specifically with reference to the following embodiments. It is to be noted that the following descriptions of preferred embodiments are presented herein for purpose of illustration and description only. It is not intended to be exhaustive or to be limited to the precise form disclosed.

Figure 1:
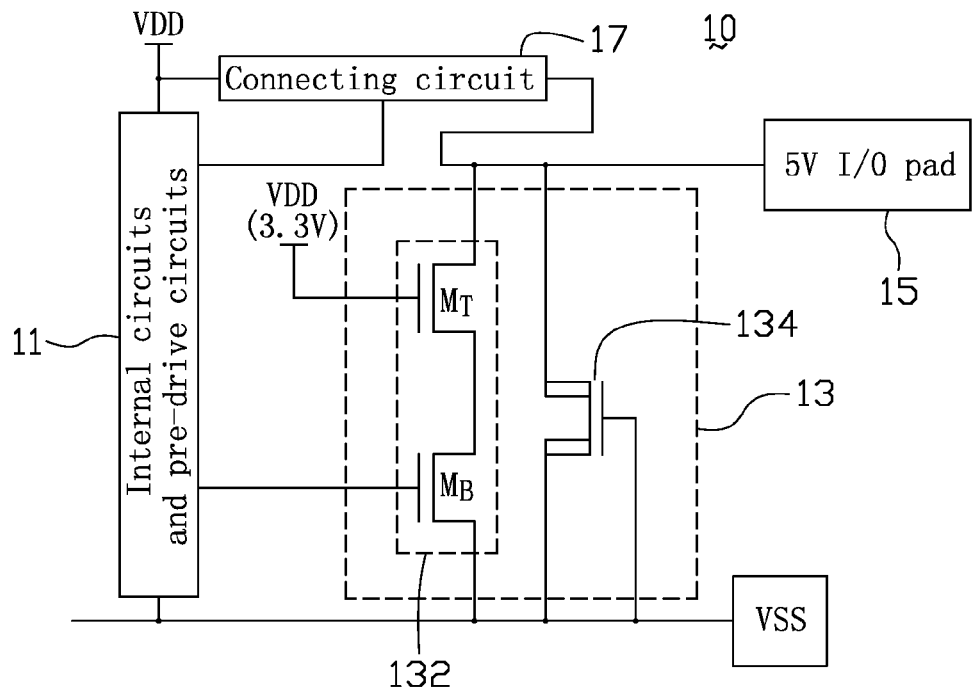
FIG. 1 is a schematic circuit structural diagram of a high-voltage tolerant I/O circuit with an ESD protection device in accordance with an exemplary embodiment.

Referring to FIG. 1, FIG. 1 is a schematic circuit structural diagram of a high-voltage tolerant I/O circuit with an ESD protection device in accordance with an exemplary embodiment. As illustrated in FIG. 1, the ESD protection device 13 serves as a part of the high-voltage tolerant I/O circuit 10. In particular, the ESD protection device 13 includes a stacked nMOS transistor 132 and a gate-grounded nMOS transistor 134.

The stacked nMOS transistor 132 and the gate-grounded nMOS transistor 134 are electrically coupled in parallel to an I/O pad (e.g., 5V I/O) 15 and a grounding voltage VSS of the high-voltage tolerant I/O circuit 10. The I/O pad 15 is electrically coupled to internal circuits and pre-drive circuits 11 and a power supply voltage VDD (e.g., 3.3V) through a connecting circuit 17. Herein, the connecting circuit 17 for example is a transistor. The stacked nMOS transistor 132 can limit the voltage at the I/O pad 15 within a predetermined voltage range. The stacked nMOS transistor 132 includes a top nMOS transistor $M_T$ and a bottom nMOS transistor $M_B$. For the top nMOS transistor $M_T$, the drain is electrically coupled to the I/O pad 15, and the gate is electrically coupled to the power supply voltage VDD. For the bottom nMOS transistor $M_B$, the drain is electrically coupled to the source of the top nMOS transistor $M_T$, the gate is electrically coupled to the internal circuits and pre-drive circuits 11 of the high-voltage tolerant I/O circuit 10, and the source is electrically coupled to the grounding voltage VSS. In the illustrated embodiment, the stacked nMOS transistor 132 for example is a lightly doped drain (LDD) type stacked transistor. It is indicated that, the present disclosure will emphasize the design of the ESD protection device 13, the other circuits' design of the high-voltage tolerant I/O circuit 10 can refer to the related arts and thus will be omitted.

In regard to the gate-grounded nMOS transistor 134, the drain is electrically coupled to the I/O pad 15, and the gate and source both are electrically coupled to the grounding voltage VSS.

In short, in the illustrated embodiment, by adding the gate-grounded nMOS transistor 134 to be electrically coupled in parallel with the stacked nMOS transistor 132, the better ESD level of the gate-grounded nMOS transistor 134 is in use for improving the whole ESD level of the ESD protection device 13. Advantageously, in order to further optimize the ESD level of the gate-grounded nMOS transistor 134, the gate-grounded nMOS transistor 134 is configured to be a non-LDD type gate-grounded nMOS transistor.

Hereinafter, how to achieve the effect of improving ESD level without increasing device layout area associated with the ESD protection device 13 in FIG. 1 will be described below in detail from the viewpoint of layout structure with reference to FIGS. 2 through 5.

[First Embodiment]

Figure 2:
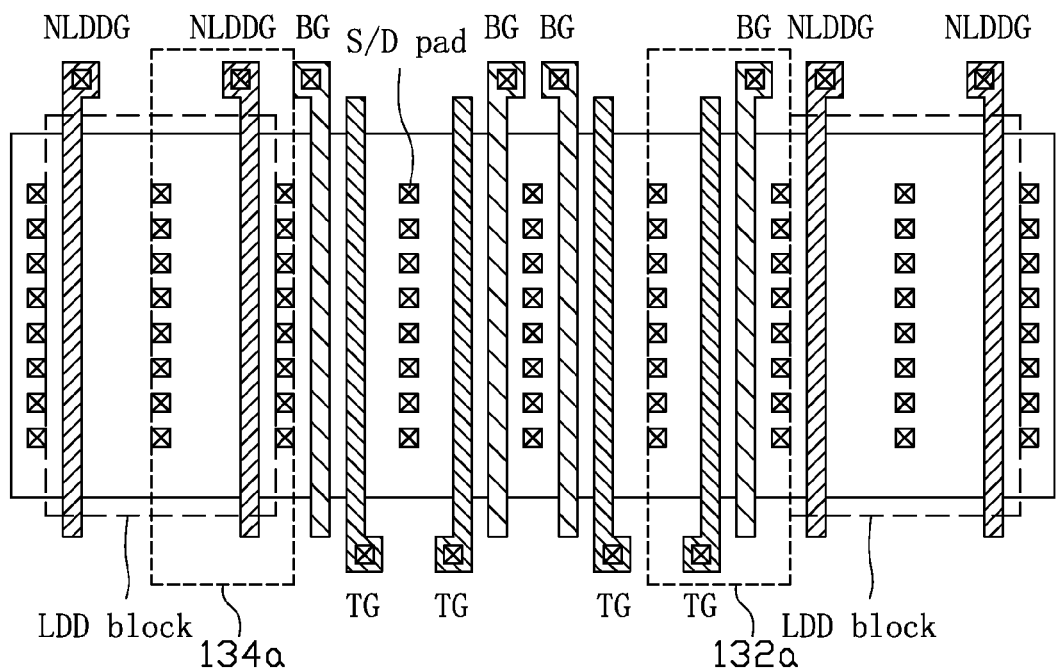
FIG. 2 is a schematic layout structure view of the ESD protection device in FIG. 1, in accordance with a first exemplary embodiment.

FIG. 2 is a schematic layout structure view of the ESD protection device 13 in FIG. 1. Specifically, referring to FIGS. 1 and 2 together, the stacked nMOS transistor 132 in FIG. 1 for example is a multi-finger stacked nMOS transistor, and a layout structure thereof includes multiple finger stacked nMOS transistor structures 132a. Similarly, the gate-grounded nMOS transistor 134 in FIG. 1 for example is a multi-finger gate-grounded nMOS transistor, and a layout structure thereof includes multiple finger gate-grounded nMOS transistor structures 134a.

In particular, the stacked nMOS transistor 132 for example includes four finger stacked nMOS transistor structures 132a. Each of the finger stacked nMOS transistor structures 132a includes top and bottom gate fingers TG, BG, and a source and a drain (not labeled) disposed at two sides of the top and bottom gate fingers TG, BG for wiring; each of the source and the drain is formed with at least one S/D pad. The four finger stacked nMOS transistor structures 132a are arranged successively along the horizontal direction of FIG. 2.

The gate-grounded nMOS transistor 134 for example includes four finger gate-grounded nMOS transistor structures 134a. Each of the finger gate-grounded nMOS transistor structures 134a includes a gate finger NLDDG, and a source and a drain (not labeled) disposed at two sides of the gate finger NLDDG for wiring; each of the source and the drain is formed with at least one S/D pad. The four finger gate-grounded nMOS transistor structures 134a are arranged at two sides of the successively-arranged four finger stacked nMOS transistor structures 132a along the horizontal direction of FIG. 2 on a same substrate, so that the four finger gate-grounded nMOS transistor structures 134a and the four finger stacked nMOS transistor 132a are arranged intervally along the horizontal direction of FIG. 2. Moreover, during forming the four finger gate-grounded nMOS transistor structures 134a, a LDD block/mask is used for facilitating the four finger gate-grounded nMOS transistor structures 134a to be non-LDD finger gate-grounded nMOS transistor structures.

In addition, as seen from FIG. 2 that: each of the finger gate-grounded nMOS transistor structures 134a has an equal layout area with respect to each of the finger stacked nMOS transistor structures 132a, but has less gate finger from the appearance point of view.

[Second Embodiment]

Figure 3:
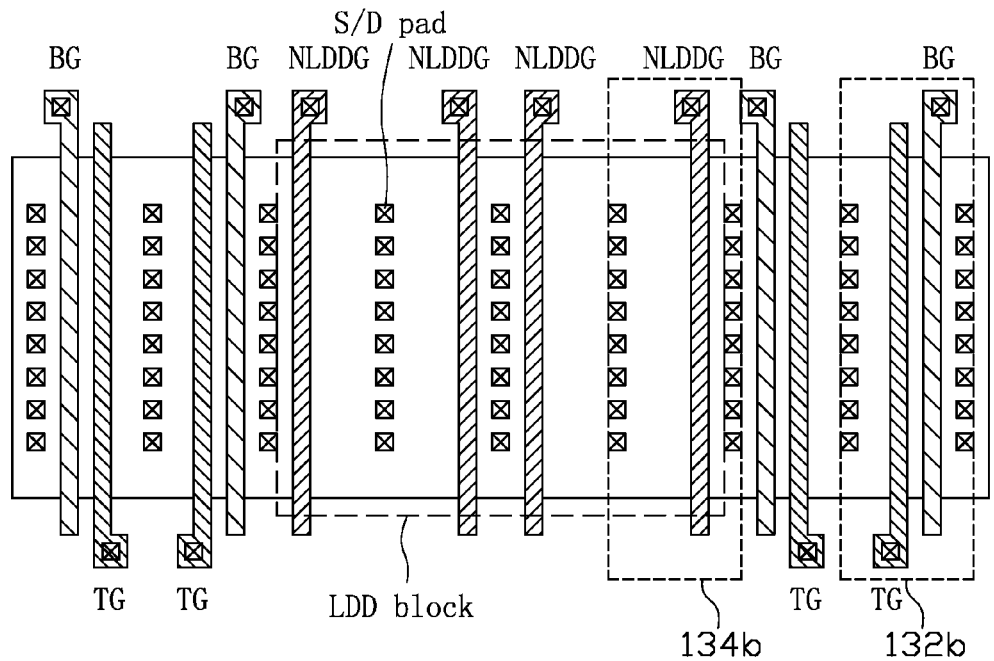
FIG. 3 is a schematic layout structure view of the ESD protection device in FIG. 1, in accordance with a second exemplary embodiment.

FIG. 3 is another schematic layout structure view of the ESD protection device 13 in FIG. 1. Specifically, referring to FIGS. 1 and 3 together, the stacked nMOS transistor 132 in FIG. 1 for example is a multi-finger stacked nMOS transistor, and a layout structure thereof includes multiple finger stacked nMOS transistor structures 132b. Similarly, the gate-grounded nMOS transistor 134 in FIG. 1 for example is a multi-finger gate-grounded nMOS transistor, and a layout structure thereof includes multiple finger gate-grounded nMOS transistor structures 134b.

In particular, the stacked nMOS transistor 132 for example includes four finger stacked nMOS transistor structures 132b. Each of the finger stacked nMOS transistor structures 132b includes top and bottom gate fingers TG, BG, and a source and a drain (not labeled) disposed at two sides of the top and bottom gate fingers TG, BG for wiring; each of the source and the drain is formed with at least one S/D pad.

The gate-grounded nMOS transistor 134 for example includes four finger gate-grounded nMOS transistor structures 134b. Each of the finger gate-grounded nMOS transistor structures 134b includes a gate finger NLDDG, and a source and a drain (not labeled) disposed at two sides of the gate finger NLDDG for wiring; each of the source and the drain is formed with at least one S/D pad. The four finger gate-grounded nMOS transistor structures 134b are arranged successively along the horizontal direction of FIG. 3. Moreover, during forming the four gate-grounded nMOS transistor structures 134b, a LDD block/mask is used for facilitating the four finger gate-grounded nMOS transistor structures 134b to be non-LDD type finger gate-grounded nMOS transistor structures. In addition, the four finger stacked nMOS transistor structures 132b are arranged at two sides of the successively-arranged four finger gate-grounded nMOS transistor structures 134b along the horizontal direction of FIG. 3 on a same substrate, so that the four finger stacked transistor structures 132b and the four finger gate-grounded transistor structures 134b are arranged intervally along the horizontal direction of FIG. 3.

Additionally, as seen from FIG. 3 that: each of the finger gate-grounded nMOS transistor structures 134b has an equal layout area with respect to each of the finger stacked nMOS transistor structures 132b, but has less gate finger from the appearance point of view.

[Third Embodiment]

Figure 4:
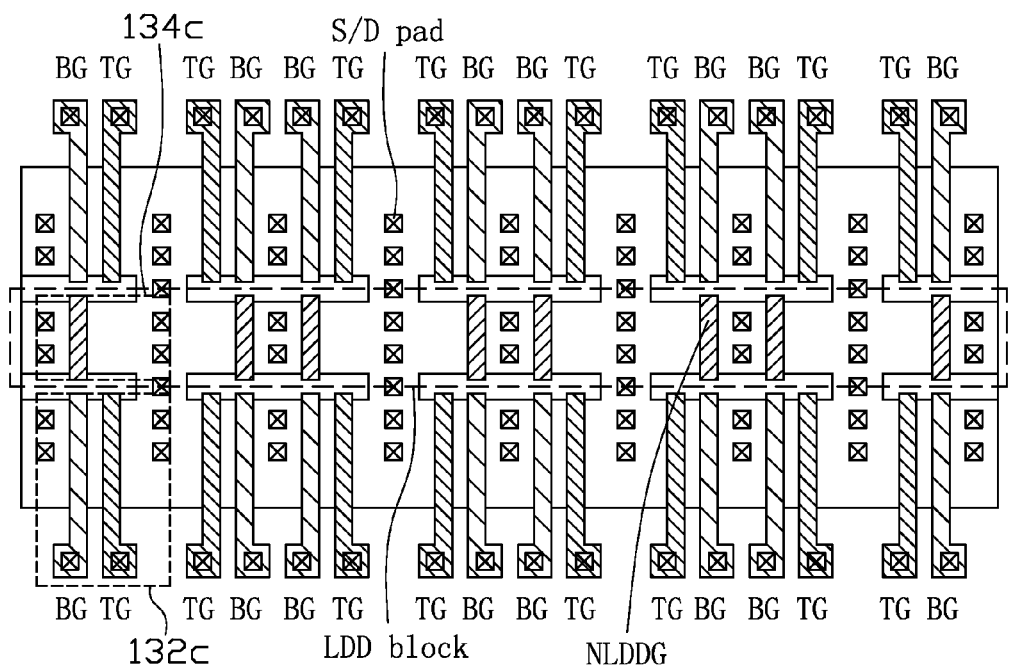
FIG. 4 is a schematic layout structure view of the ESD protection device in FIG. 1, in accordance with a third exemplary embodiment.

FIG. 4 is still another schematic layout structure view of the ESD protection device 13 in FIG. 1. Specifically, referring to FIGS. 1 and 4 together, the stacked nMOS transistor 132 in FIG. 1 for example is a multi-finger stacked nMOS transistor, and a layout structure thereof includes multiple finger stacked nMOS transistor structures 132c. Similarly, the gate-grounded nMOS transistor 134 in FIG. 1 for example is a multi-finger gate-grounded nMOS transistor, and a layout structure thereof includes multiple finger gate-grounded nMOS transistor structures 134c.

In particular, the stacked nMOS transistor 132 for example includes sixteen finger stacked nMOS transistor structures 132c. Each of the finger stacked nMOS transistor structures 132c includes top and bottom gate fingers TG, BG, and a source and a drain (not labeled) disposed at two sides of the top and bottom gate fingers TG, BG for wiring; each of the source and the drain is formed with at least one S/D pad. The sixteen finger stacked nMOS transistor structures 132c are arranged in two rows on the vertical direction of FIG. 4, and each row includes eight finger stacked nMOS transistor structures 132c arranged successively along the horizontal direction of FIG. 4.

The gate-grounded nMOS transistor 134 for example includes eight finger gate-grounded nMOS transistor structures 134c. Each of the finger gate-grounded nMOS transistor structures 134c includes a gate finger NLDDG, and a source and a drain (not labelled) disposed at two sides of the gate finger NLDDG for wiring; each of the source and the drain is formed with at least one S/D pad. The eight finger gate-grounded nMOS transistor structures 134c are arranged successively along the horizontal direction of FIG. 4 in one row. Each of the finger gate-grounded nMOS transistor structures 134c is disposed between corresponding two finger stacked nMOS transistor structures 132c along the vertical direction of FIG. 4, so that the row of finger gate-grounded nMOS transistor structure 134c and the two rows of finger stacked nMOS transistor structures 132c are arranged intervally along the vertical direction of FIG. 4 on a same substrate. Moreover, during forming the eight finger gate-grounded nMOS transistor structures 134c, a LDD block/mask is used for facilitating the eight finger gate-grounded nMOS transistor structures 134c to be non-LDD type finger gate-grounded nMOS transistor structures.

In addition, along the vertical direction of FIG. 4, the bottom gate fingers BG of two finger stacked nMOS transistor structures 132c and the gate finger NLDDG of one finger gate-grounded nMOS transistor structure 134c in a same column are co-linear, but it is not to limit the present disclosure, it may be the situation that the top gate fingers TG and the gate finger NLDDG are co-linear instead.

[Fourth Embodiment]

Figure 5:
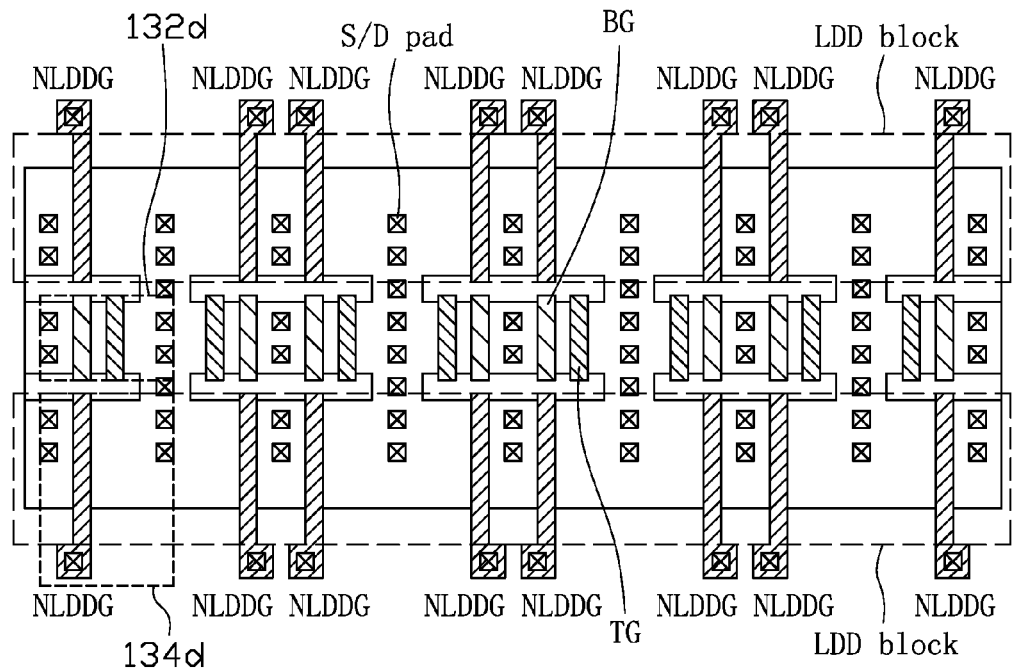
FIG. 5 is a schematic layout structure view of the ESD protection device in FIG. 1, in accordance with a fourth exemplary embodiment.

FIG. 5 is even still another schematic layout structure view of the ESD protection device 13 in FIG. 1. Specifically, referring to FIGS. 1 and 5 together, the stacked nMOS transistor 132 in FIG. 1 for example is a multi-finger stacked nMOS transistor, and a layout structure thereof includes multiple finger stacked nMOS transistor structures 132d. Similarly, the gate-grounded nMOS transistor 134 in FIG. 1 for example is a multi-finger gate-grounded nMOS transistor, and a layout structure thereof includes multiple finger gate-grounded nMOS transistor structures 134d.

In particular, the stacked nMOS transistor 132 for example includes eight finger stacked nMOS transistor structures 132d. Each of the finger stacked nMOS transistor structures 132d includes top and bottom gate fingers TG, BG, and a source and a drain (not labeled) disposed at two sides of the top and bottom gate fingers TG, BG for wiring; each of the source and the drain is formed with at least one S/D pad. The eight finger stacked nMOS transistor structures 132d are arranged successively along the horizontal direction of FIG. 5 in one row.

The gate-grounded nMOS transistor 134 for example includes sixteen finger gate-grounded nMOS transistor structures 134d. Each of the finger gate-grounded nMOS transistor structures 134d includes a gate finger NLDDG, and a source and a drain (not labelled) disposed at two sides of the gate finger NLDDG for wiring; each of the source and the drain is formed with at least one S/D pad. The sixteen finger gate-grounded nMOS transistor structures 134d are arranged in two rows on the vertical direction of FIG. 5, and each row includes eight finger gate-grounded nMOS transistor structures 134d arranged successively along the horizontal direction of FIG. 5. Two sides of each of the finger stacked nMOS transistor structures 132d respectively have two finger gate-grounded nMOS transistor structures 134d, so that the two rows of finger gate-grounded nMOS transistor structures 134d and the row of finger stacked nMOS transistor structures 132d are arranged intervally along the vertical direction of FIG. 5 on a same substrate. Moreover, during forming the sixteen finger gate-grounded nMOS transistor structures 134d, a LDD block/mask is used for facilitating the sixteen finger gate-grounded nMOS transistor structures 134d to be non-LDD type finger gate-grounded nMOS transistor structures.

In addition, along the vertical direction of FIG. 5, the bottom gate fingers BG of one finger stacked nMOS transistor structure 132d and the gate fingers NLDDG of two finger gate-grounded nMOS transistor structures 134d in a same column are co-linear, but it is not to limit the present disclosure, it may be the situation that the top gate finger TG and the gate fingers NLDDG are co-linear instead.

[Fifth Embodiment]

Figure 6:
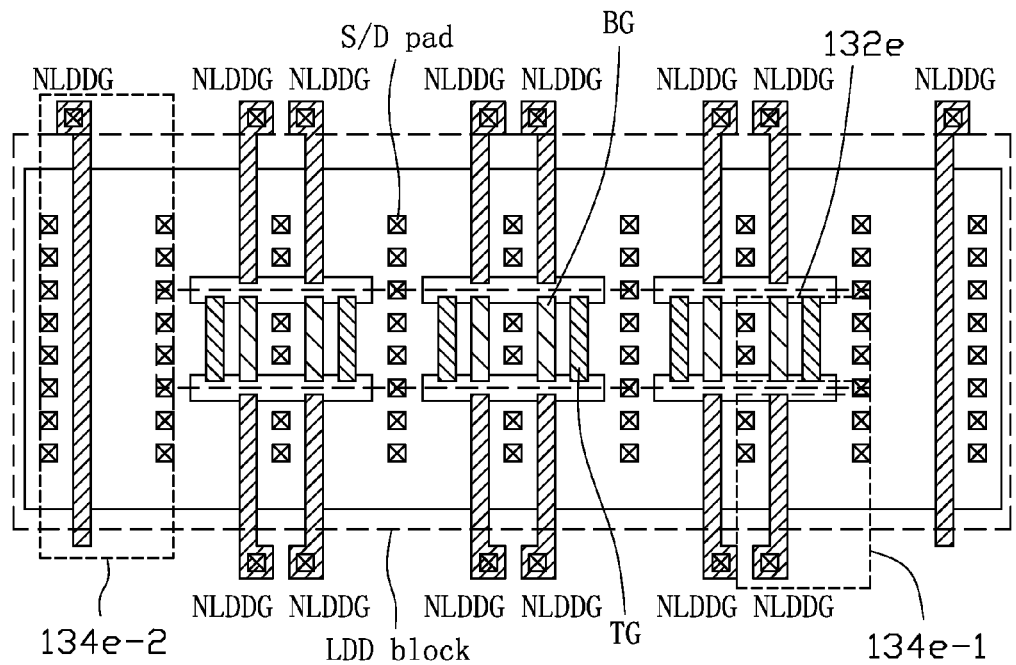
FIG. 6 is a schematic layout structure view of the ESD protection device in FIG. 1, in accordance with a fifth exemplary embodiment.

FIG. 6 is further even still another schematic layout structure view of the ESD protection device 13 in FIG. 1. Specifically, referring to FIGS. 1 and 6 together, the stacked nMOS transistor 132 in FIG. 1 for example is a multi-finger stacked nMOS transistor, and a layout structure thereof includes multiple finger stacked nMOS transistor structures 132e. Similarly, the gate-grounded nMOS transistor 134 in FIG. 1 for example is a multi-finger gate-grounded nMOS transistor, and a layout structure thereof includes multiple finger gate-grounded nMOS transistor structures 134e-1, 134e-2.

In particular, the stacked nMOS transistor 132 for example includes six finger stacked nMOS transistor structures 132e. Each of the finger stacked nMOS transistor structures 132e includes top and bottom gate fingers TG, BG, and a source and a drain (not labeled) disposed at two sides of the top and bottom gate fingers TG, BG for wiring; each of the source and the drain is formed with at least one S/D pad. The six finger stacked nMOS transistor structures 132e are arranged successively along the horizontal direction of FIG. 6 in one row.

The gate-grounded nMOS transistor 134 for example includes twelve finger gate-grounded nMOS transistor structures 134e-1 and two finger gate-grounded nMOS transistor structures 134e-2. Each of the finger gate-grounded nMOS transistor structures 134e-1, 134e-2 includes a gate finger NLDDG, and a source and a drain (not labelled) disposed at two sides of the gate finger NLDDG for wiring; each of the source and the drain is formed with at least one S/D pad. The twelve finger gate-grounded nMOS transistor structures 134e-1 are arranged in two rows on the vertical direction of FIG. 6, and each row includes six finger gate-grounded nMOS transistor structures 134e-1 arranged successively along the horizontal direction of FIG. 6. Two sides of each of the finger stacked nMOS transistor structures 132e respectively have two finger gate-grounded nMOS transistor structures 134e-1 along the vertical direction of FIG. 6, so that the two rows of finger gate-grounded nMOS transistor structures 134e-1 and the row of finger stacked nMOS transistor structures 132e are arranged intervally along the vertical direction of FIG. 6 on a same substrate. Moreover, the two finger gate-grounded nMOS transistor structures 134e-2 are successively arranged with the twelve finger gate-grounded nMOS transistor structures 134e-1, so that the fourteen finger gate-grounded nMOS transistor structures 134e-1, 134e-2 as a whole are arranged in a shape of ring e.g., rectangle ring to surround the six finger stacked nMOS transistor structures 132e. Accordingly, during forming the fourteen finger gate-grounded nMOS transistor structures 134e-1, 134e-2, a rectangle ring shaped LDD block/mask is adopted for facilitating the fourteen finger gate-grounded nMOS transistor structures 134e-1, 134e-2 to be non-LDD type finger gate-grounded nMOS transistor structures.

In addition, along the vertical direction of FIG. 6, the bottom gate fingers BG of one finger stacked nMOS transistor structure 132e and the gate fingers NLDDG of two finger gate-grounded nMOS transistor structures 134e-1 in a same column are co-linear, but it is not to limit the present disclosure, it may be the situation that the top gate finger TG and the gate fingers NLDDG are co-linear instead.

Additionally, it can be understood to the skilled in the art, although the quantity of the finger stacked nMOS transistor structures and the quantity of the finger gate-grounded nMOS transistor structures are designed to satisfy a relationship of integer times (e.g., one times or multiple times) or non-integer times, the values of the quantities can be flexibly set according to actual application requirement and thus not be limited to the above examples. The transistor-type(s) of the stacked nMOS transistor 132 and/or the gate-grounded nMOS transistor 134 can be suitably modified according to actual application requirement. Furthermore, the ESD protection device 13 is not limited to be applied to the high-voltage tolerant I/O circuit, and can be applied to other type of I/O circuit instead for improving the ESD level of such I/O circuit.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation to encompass all such modifications and similar structures.

What is claimed is:

1. An ESD protection device, adapted for a high-voltage tolerant I/O circuit, comprising:
    a stacked transistor; and
    a gate-grounded transistor;
    wherein the stacked transistor and the gate-grounded transistor are electrically coupled in parallel between an I/O pad and a grounding voltage of the high-voltage tolerant I/O circuit,
    wherein the gate-grounded transistor is a non-stacked transistor;
    a layout structure of the stacked transistor comprises a plurality of first finger transistor structures, each of the plurality of first finger transistor structures comprising two first gate fingers;
    a layout structure of the gate-grounded transistor comprises a plurality of second finger transistor structures, each of the plurality of second finger transistor structures comprising a second gate finger; and
    the plurality of first finger transistor structures and the plurality of second finger transistor structures are arranged intervally along a first direction.

2. The ESD protection device as claimed in claim 1, wherein the gate-grounded transistor is a non-lightly doped drain type gate-grounded transistor, and the stacked transistor is a lightly doped drain type stacked transistor.

3. The ESD protection device as claimed in claim 1, wherein the plurality of second finger transistor structures are arranged at two sides of the plurality of first finger transistor structures along the first direction.

4. The ESD protection device as claimed in claim 1, wherein the plurality of first finger transistor structures are arranged at two sides of the plurality of second finger transistor structures along the first direction.

5. The ESD protection device as claimed in claim 1, wherein each of the plurality of first finger transistor structures and each of the plurality of second finger transistor structures have equal layout areas.

6. The ESD protection device as claimed in claim 1, wherein the plurality of first finger transistor structures and the plurality of second finger transistor structures have the same quantity.

7. An ESD protection device, adapted for a high-voltage tolerant I/O circuit, comprising
a stacked transistor; and
a gate-grounded transistor;
wherein the stacked transistor and the gate-grounded transistor are electrically coupled in parallel between an I/O pad and a grounding voltage of the high-voltage tolerant I/O circuit,
wherein the gate-grounded transistor is a non-stacked transistor,
wherein the gate-grounded transistor is a non-lightly doped drain type gate-grounded transistor, and the stacked transistor is a lightly doped drain type stacked transistor;
a layout structure of the stacked transistor comprises a plurality of first finger transistor structures, each of the plurality of first finger transistor structures comprising two first gate fingers;
a layout structure of the gate-grounded transistor comprises a plurality of second finger transistor structures, each of the plurality of second finger transistor structures comprising a second gate finger; and
the plurality of first finger transistor structures are arranged successively along a first direction, the plurality of second finger transistor structures are arranged successively along the first direction, and the plurality of first finger transistor structures and the plurality of second finger transistor structures are arranged intervally along a second direction different from the first direction.

8. The ESD protection device as claimed in claim 7, wherein the plurality of first finger transistor structures are arranged at two sides of the plurality of second finger transistor structures along the second direction.

9. The ESD protection device as claimed in claim 7, wherein the plurality of second finger transistor structures are arranged at two sides of the plurality of first finger transistor structures along the second direction.

10. The ESD protection device as claimed in claim 7, wherein the plurality of second finger transistor structures are successively arranged in a shape of ring to surround the plurality of first finger transistor structures.

11. The ESD protection device as claimed in claim 7, wherein along the second direction, the second gate finer of at least one of the plurality of second finger transistor structures is co-linear with one of the two first gate fingers of at least one of the plurality of first finger transistor structures.

12. The ESD protection device as claimed in claim 7, wherein the quantity of the plurality of first finger transistor structures and the quantity of the plurality of second finger transistor structures satisfy a relationship of integer times.

13. The ESD protection device as claimed in claim 7, wherein the quantity of the plurality of second finger transistor structures and the quantity of the plurality of first finger transistor structures satisfy a relationship of non-integer times.

14. An ESD protection device, a layout structure of the ESD protection device comprising:
a plurality of finger stacked transistor structures; and
a plurality of finger gate-grounded transistor structures;
wherein the plurality of finger stacked transistor structures and the plurality of finger gate-grounded transistor structures all are electrically coupled between an I/O pad and a grounding voltage, the plurality of finger stacked transistor structures and the plurality of finger gate-grounded transistor structures are arranged intervally along a specified direction.

15. The ESD protection device as claimed in claim 14, wherein the plurality of finger stacked transistor structures are arranged successively along a second direction different from the specified direction, and the plurality of finger gate-grounded transistor structures are arranged successively along the second direction.

16. The ESD protection device as claimed in claim 15, wherein along the specified direction, a gate finger of at least one of the plurality of finger gate-grounded transistor structure and a gate finger of at least one of the plurality of finger stacked transistor structure are co-linear.

17. The ESD protection device as claimed in claim 14, wherein the plurality of finger gate-grounded transistor structures are successively arranged in a shape of ring to surround the plurality of finger stacked transistor structures.

18. The ESD protection device as claimed in claim 14, wherein the quantity of the plurality of finger stacked transistor structures and the quantity of the plurality of finger gate-grounded transistor structures satisfy a relationship of integer times therebetween.

* * * * *